United States Patent [19]

Woo

[11] Patent Number: 5,532,182
[45] Date of Patent: Jul. 2, 1996

[54] METHOD FOR FABRICATING STACKED CAPACITOR OF A DRAM CELL

[75] Inventor: Sang H. Woo, Kyoungki-do, Rep. of Korea

[73] Assignee: Hyundai Electronics Industries Co., Ltd., Rep. of Korea

[21] Appl. No.: 365,562

[22] Filed: Dec. 28, 1994

[30] Foreign Application Priority Data

Dec. 28, 1993 [KR] Rep. of Korea ............... 93-30484

[51] Int. Cl.⁶ .................... H01L 21/70; H01L 27/00
[52] U.S. Cl. .................. 437/52; 437/47; 437/60; 437/919
[58] Field of Search ............... 437/47, 60, 52, 437/919

[56] References Cited

U.S. PATENT DOCUMENTS

| | | | |
|---|---|---|---|
| 5,164,337 | 11/1992 | Ogawa et al. | 437/52 |
| 5,236,859 | 8/1993 | Bae et al. | 437/52 |
| 5,240,871 | 8/1993 | Doan et al. | 437/47 |

*Primary Examiner*—George Fourson
*Assistant Examiner*—H. Jey Tsai
*Attorney, Agent, or Firm*—Merchant, Gould, Smith, Edell, Welter & Schmidt

[57] ABSTRACT

There is disclosed a method for the fabrication of a capacitor of a DRAM, comprising the characteristic steps of: forming a bellows type storage electrode; depositing an impurity-doped polysilicon film on the entire surface of the storage electrode; and diffusing the dopants into impurity-rare edge portions of the storage electrode through an annealing treatment. Accordingly, it is capable of easily securing the capacitance of a capacitor in greater quantity per unit area, and thus, effects a reduction in production cost.

7 Claims, 4 Drawing Sheets

METHOD FOR FABRICATING STACKED CAPACITOR OF A DRAM CELL

BACKGROUND OF THE INVENTION

1. Field of the Invention

The present invention relates, in general, to a method for fabricating a DRAM cell, and more particularly, to a method for increasing the efficient area of a bellows-type storage electrode, thereby increasing the capacitance of a capacitor of a DRAM cell.

2. Description of the Prior Art

As the area which is occupied by a unit cell decreases, the integration degree of a semiconductor device increases. However, the high integration of a semiconductor device requires that a capacitor not be reduced in the capacitance necessary to operate, for example, a DRAM cell and secure at least about 40 femtofared (fF).

Based on such requirements for the high integration of a semiconductor device, various structures of a capacitor have been developed to secure a sufficient capacitance of a unit DRAM cell in such reduced area. For example, three-dimensional structures of a capacitor, such as stack, cylinder, pin and so on, were fabricated.

Of those three-dimensional structures of a capacitor, pin-type capacitors have widely been employed due to their simple fabrication processes. As the cell area is reduced, the number of pins should be increased to maintain the capacitance of the capacitor at a requisite level. A significant disadvantage of the conventional pin-type capacitors is that numerous process steps must be undertaken to increase the number of the pins. That is, many insulation layers and polysilicon layers are repeatedly formed, conducting a large number of CVD processes. In the meanwhile, particles and defects may be more frequently generated, thereby decreasing the production yield.

SUMMARY OF THE INVENTION

Therefore, an object of the present invention is to overcome the above problems encountered in the prior art and to provide a method for fabricating a capacitor of a DRAM cell, capable of easily securing the capacitance of a capacitor in greater quantity per unit area.

Based on the intensive and thorough research and study by the present inventors, the above object can be accomplished by providing a method for fabricating a capacitor of a DRAM cell, comprising the steps of: conducting the formation of an MOS transistor on a semiconductor substrate, the deposition of an insulation layer for planarization on the MOS transistor and the formation of a storage electrode contact hole; depositing an undoped, first amorphous silicon layer, a doped, second amorphous silicon layer, a doped, third amorphous silicon layer, a doped, fourth amorphous silicon layer and an undoped, fifth amorphous silicon on the resulting structure, in sequence; forming a photosensitive film pattern for a storage electrode mask on the fifth amorphous silicon film; etching the fifth through first amorphous silicon layers to form a pattern of the fifth through first amorphous silicon layers with the photosensitive film pattern serving as a mask, and then, removing the photosensitive film pattern; annealing the pattern of the first through fifth amorphous silicon layers under a predetermined condition, to transform the first through fifth amorphous silicon layers into corresponding polysilicon layers with the dopants contained in the doped layers being activated and not diffused into the undoped layers; treating the first through fifth polysilicon layers with a selective chemical etchant to form grooves only in the doped second polysilicon layer and the doped fourth polysilicon layer; diffusing the dopants in the second and fourth polysilicon layers into the first, third and fifth polysilicon layers by use of a heat treatment, to form a storage electrode; depositing a thin, phosphorous-doped polysilicon film on the entire surface of the storage electrode; and diffusing the dopant contained in the polysilicon film into the storage electrode through heat treatment, to form a bellows type storage electrode.

BRIEF DESCRIPTION OF THE DRAWINGS

The above object and other advantages of the present invention will become more apparent by describing in detail the preferred embodiments of the present invention with reference to the attached drawings in which.

DETAILED DESCRIPTION OF THE PREFERRED EMBODIMENTS

Figure 1:
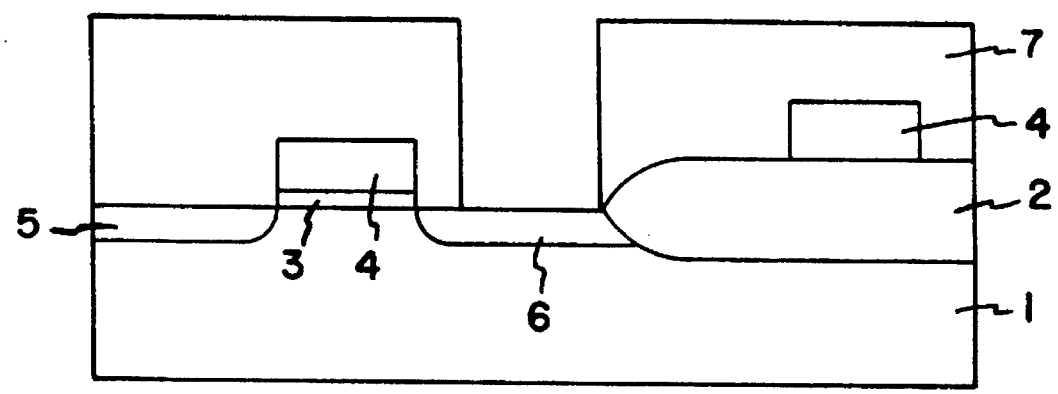
FIGS. 1 through 7 are schematic cross sectional views illustrating a process for the fabrication of capacitor of DRAM cell.

The application of the preferred embodiments of the present invention is best understood with reference to the accompanying drawings, wherein like reference numerals are used for like and corresponding parts, respectively.

First, referring initially to FIG. 1, there is shown an MOS transistor formed in a semiconductor substrate 1. As shown in this figure, a field oxide film 2, a gate oxide film 3, a word line 4, a drain 5 and a source 6 are provided to the semiconductor substrate 1. A blanket insulation film 7 for planarization is formed on the resulting structure and then, selectively etched to form a contact hole 8 which exposes the contact hole therethrough.

Figure 2:
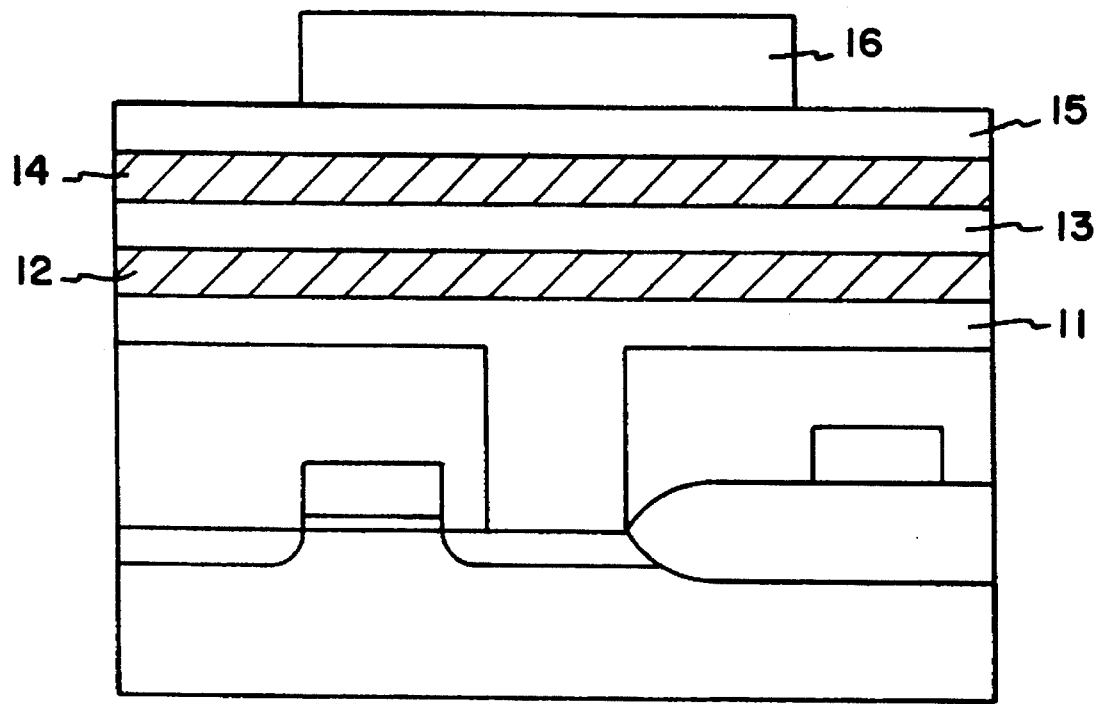

FIG. 2 is a cross section of the DRAM cell after an undoped, first amorphous silicon layer 11, a doped, second amorphous silicon layer 12, a doped, third amorphous silicon layer 13, a doped, fourth amorphous silicon layer 14 and an undoped, fifth amorphous silicon 15 are formed in sequence, followed by the formation of a photosensitive film pattern 16 for a storage electrode mask. The pure amorphous layers, that is, the first, the second, and the third amorphous layers 11, 13, 15 are formed at a temperature of not more than 550° C. in their respective predetermined thicknesses of, for example, about 300 to about 1,000 Å by use of $Si_2H_6$ or $SiH_4$ source gas. Likewise, the doped amorphous layers, that is, the second and the fourth amorphous layers 12 and 14, are formed at a temperature of not more than 550° C. in their respective predetermined thicknesses of, for example, about 300 to 1,000 Å. Whereas, for the doped amorphous layers, $Si_2H_6$ or $SiH_4$ gas and $PH_3$ gas are used with the aim of introduction of phosphorous thereunto.

It should be noted that when the first through fifth amorphous silicon layers 11, 12, 13, 14, 15 are deposited, the deposition temperature is not more than 550° C. The reason why the temperature does not exceed 550° C. is that the phosphorous dopant present in the second and the fourth amorphous silicon layers might not be diffused into the pure, first, third and fifth amorphous silicon layers when their own subsequent deposition processes are conducted.

Upon doping the second and the fourth amorphous silicon layers with phosphorous, it is important to flow the dopant in a large quantity in order to saturate the resulting doped layers therewith.

Figure 3:
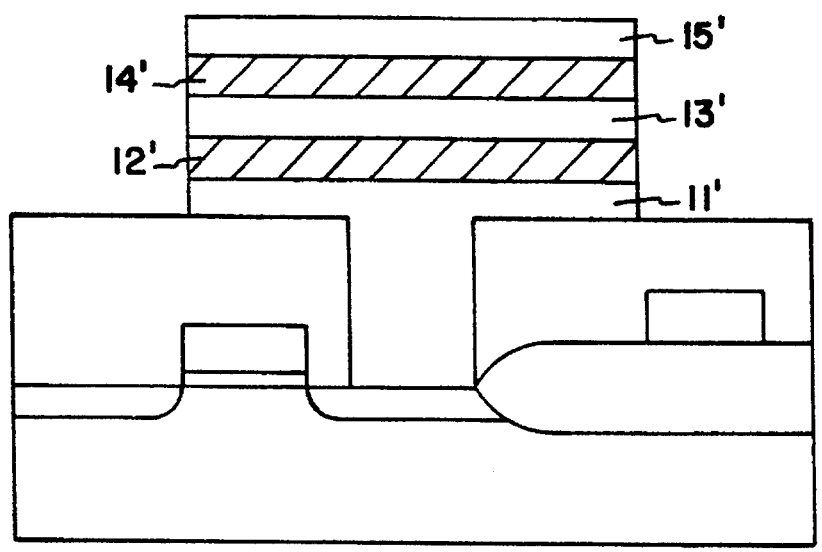

FIG. 3 is a cross section of the DRAM cell after the fifth, the fourth, the third, the second and the first amorphous silicon layers 15, 14, 13, 12, 11 are etched, in due order, with a mask of the photosensitive film pattern 16, followed by the annealing treatment of the resulting amorphous silicon layer pattern. In advance of this annealing treatment, the photosensitive pattern is taken off. The annealing treatment is conducted at a temperature of about 600° to 650° C. for a period of about 0.5 to 3 hours in an inert ambient, such as nitrogen ($N_2$) or argon (Ar), so as to make the first through fifth amorphous silicon layers 11, 12, 13, 14, 15 polycrystalline. Thus, corresponding polysilicon layers 11', 12', 13', 14', 15' are formed. The resulting structure of the first through fifth polysilicon layers 11', 12' 13' 14' 15' is referred to as a first storage electrode pattern, herein.

As previously stated, a combination of such annealing conditions, that is, a temperature of 600° to 650° C., a time of about 0.5 to 3 hours and an ambient of nitrogen or argon not only makes the amorphous silicon layers polycrystalline but also allows the dopants contained in the second and the fourth polysilicon layers 12', 14' to not be diffused into the first, the third and the fifth polysilicon layers 11', 13', 15'. For example, if the first storage electrode pattern were annealed at about 700° C. or more or at about 700° C. for not less than 1 hour, the dopants contained in the second and the fourth polysilicon layers would be diffused into the first, the third and the fifth layers, which might deleteriously affect the selective wet etching characteristic in subsequent processes.

Figure 4:
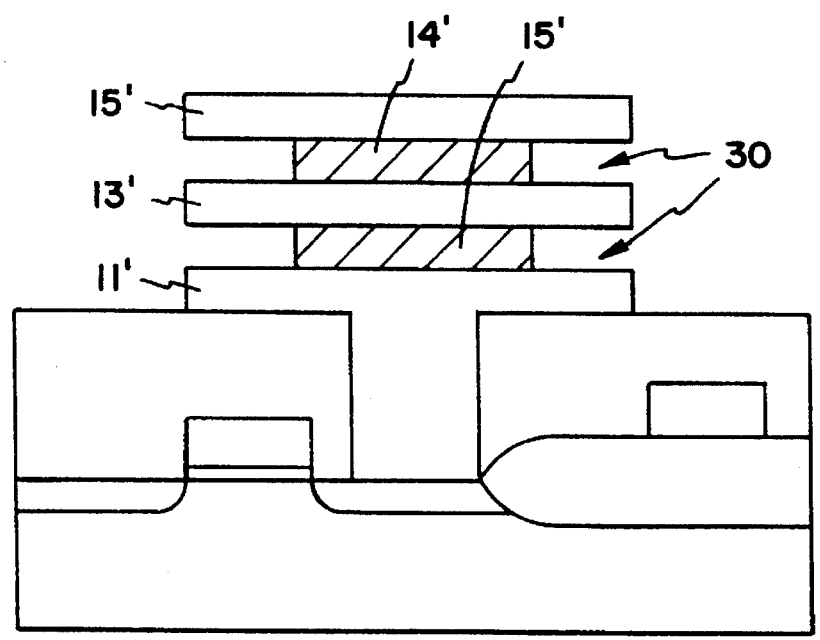

FIG. 4 is a cross section of the DRAM cell after the first through fifth polysilicon layers are treated with a chemical etchant to form grooves 30 in the doped second and fourth polysilicon layers 12' and 14'. In accordance with the present invention, the chemical etchant comprises nitric acid ($HNO_3$), acetic acid ($CH_3COOH$), hydrofluoric acid (HF) and deionized water, wherein the volume ratio of nitric acid ($HNO_3$): acetic acid ($CH_3COOH$): hydrofluoric acid (HF): deionized water is on the order of 30:3:0.5:15.0 to 30:3:1.0:15.5. The grooves 30 are attributed to the fact that the doped second and the fourth polysilicon layers 12', 14' are etched more rapidly by the chemical etchant than are the undoped first, third and fifth polysilicon layers 11', 13' 15'.

Figure 5:
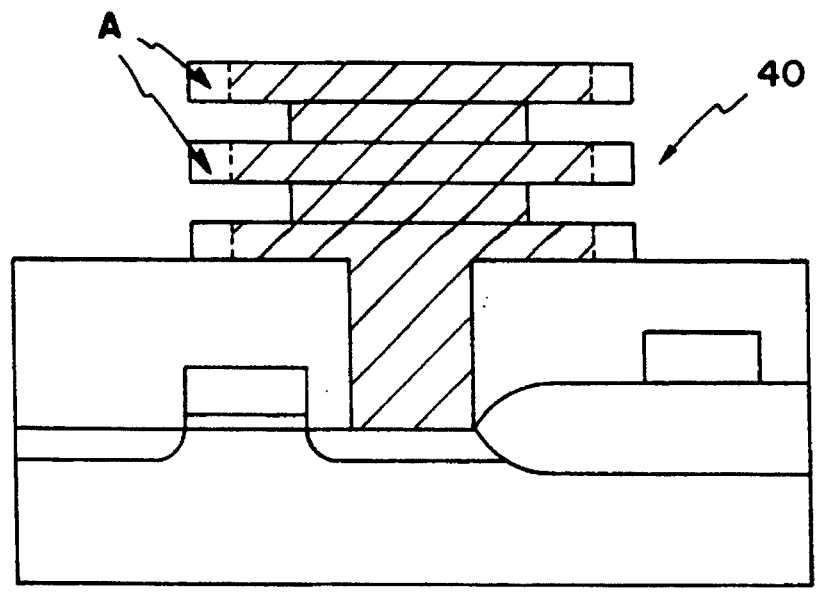

FIG. 5 is a cross section of the DRAM cell after an annealing process step is conducted at a temperature of 650° C. or more, to diffuse the dopants oversaturated in the second and the fourth polysilicon layers 12', 14' into the first, the third and the fifth polysilicon layers 11', 13', 15'. As a result, a storage electrode 40 having a bellows pin structure is formed. In the figure, reference letter "A" denotes the edge portions of the storage electrode 40 wherein the dopants are not sufficiently spread. Therefore, since these edge portions cannot function as a conducting material, the resulting capacitor comes to have a reduced effective surface area.

Figure 6:
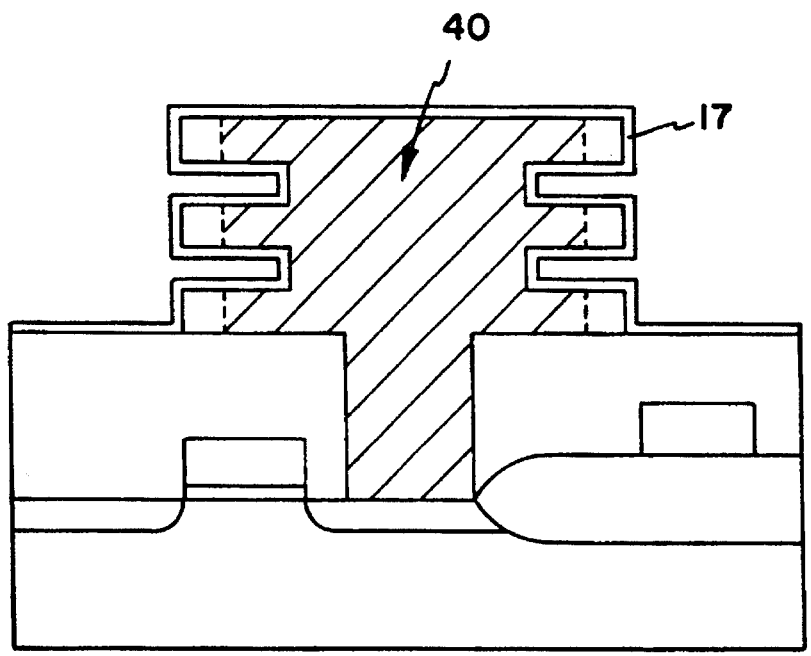

FIG. 6 is a cross section of the DRAM cell after a phosphorous-doped polysilicon layer 17 is deposited in a thickness of about 30 to 100 Å on the entire surface of the storage electrode 40 with the purpose of diffusing the dopants into the impurity-rare portions A. The phosphorous-doped polysilicon layer 17 is formed by sufficiently flowing a $PH_3$-type gas for a time of 3 to 5 minutes in order to coat phosphorous on the entire surface of the storage electrode 40, that is, by flowing thereover a mixed gas of $PH_3$ and either $Si_2H_6$ or $SiH_4$.

Figure 7:
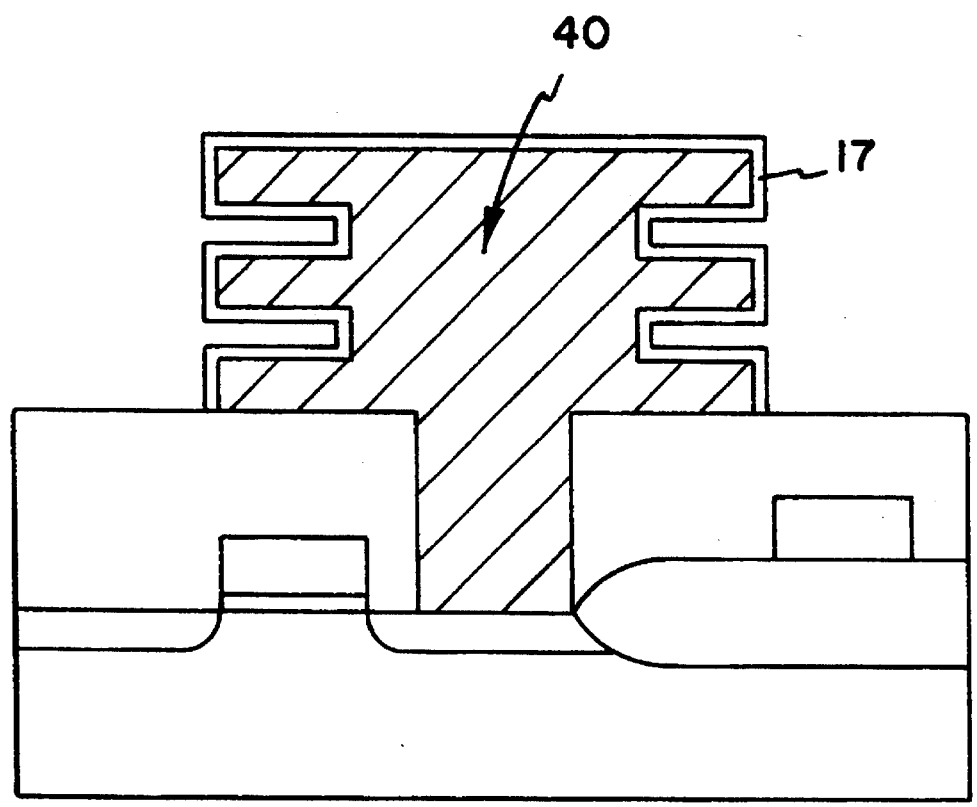

FIG. 7 is a cross section of the DRAM cell after an annealing treatment is conducted to diffuse the dopants oversaturated in the polysilicon layer 17 into the dopant-rare portions "A". As a result, a bellows-type storage electrode 40 is formed.

For formation of a capacitor, a dielectric layer and a plate electrode are formed on the surface of the storage electrode in a conventional manner.

In a storage electrode with such structure, the respective layers may be made thick while the number of the layers is large and vice versa.

As described hereinbefore, dopants can efficiently be implanted into the edge portions of pins in the storage electrode of bellows structure, according to the method of the present invention. Therefore, it can solve the problem of decreasing the capacitance of a storage electrode. In addition, the present method is simple and thus effects a reduction in production cost, as apparent from the above description.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A process for fabricating a capacitor of a DRAM cell, comprising the steps of:

forming an MOS transistor on a semiconductor substrate, depositing an insulation layer for planarization on the MOS transistor and forming a storage electrode contact hole;

then depositing an undoped, first amorphous silicon layer, a doped, second amorphous silicon layer, a doped, third amorphous silicon layer, a doped, fourth amorphous silicon layer and an undoped, fifth amorphous silicon layer;

forming a photosensitive film pattern for a storage electrode mask on the fifth amorphous silicon layer;

etching the fifth through the first amorphous silicon layers to form a pattern of the fifth through first amorphous silicon layers with the photosensitive film pattern serving as a mask, and then, removing the photosensitive film pattern;

annealing the pattern of the first through fifth amorphous silicon layers under a condition, to transform the first through fifth amorphous silicon layers into corresponding first through fifth polysilicon layers with dopants contained in the doped layers being activated and not diffused into the undoped layers;

treating the first through fifth polysilicon layers with a selective chemical etchant to form grooves only in the doped second polysilicon layer and the doped fourth polysilicon layer;

diffusing dopants in the second and fourth polysilicon layers into the first, third and fifth polysilicon layers by use of a heat treatment, to form a storage electrode;

depositing a phosphorous-doped polysilicon film on an entire surface of the storage electrode; and diffusing dopants contained in the polysilicon film into the storage electrode through a heat treatment, to form a bellows storage electrode.

2. A process in accordance with claim 1, wherein said step of depositing the first through fifth amorphous silicon layers is conducted at a temperature of not more than 550° C.

3. A process in accordance with claim 1, wherein said step of annealing the pattern of the first through fifth amorphous silicon layers is conducted at a temperature of about 600° to 650° C. for a period of about 0.5 to 3 hours.

4. A process in accordance with claim 3, wherein said annealing step is conducted in nitrogen or argon ambient.

5. A process in accordance with claim 1, wherein said second and said fourth amorphous silicon layers are saturated with dopants by flowing the dopants upon deposition.

6. A process in accordance with claim 1, wherein said selective chemical etchant is a solution containing nitric acid, acetic acid, hydrofluoric acid and deionized water wherein the volume ratio of nitric acid:acetic acid:hydrofluoric acid:deionized water is on the order of 30:3:0.5:15.0 to 30:3:1.0:15.5.

7. A process in accordance with claim 1, wherein said phosphorous-doped polysilicon film is a phosphorous-saturated polysilicon film of about 30 to 100 Å thick, which is formed by flowing a gas in a large quantity for a period of 3 to 5 minutes to coat phosphorous on the storage electrode by flowing a mixed gas of $PH_3$ and one of $Si_2H_6$ and $SiH_4$.

* * * * *